United States Patent [19]
Ha

[11] Patent Number: 6,117,715
[45] Date of Patent: Sep. 12, 2000

[54] METHODS OF FABRICATING INTEGRATED CIRCUIT FIELD EFFECT TRANSISTORS BY PERFORMING MULTIPLE IMPLANTS PRIOR TO FORMING THE GATE INSULATING LAYER THEREOF

[75] Inventor: Dae-Won Ha, Seoul, Rep. of Korea

[73] Assignee: Samsung Electronics Co., Ltd., Rep. of Korea

[21] Appl. No.: 09/143,131

[22] Filed: Aug. 28, 1998

[30] Foreign Application Priority Data

Aug. 30, 1997 [KR] Rep. of Korea .................. 97-43559

[51] Int. Cl.[7] ................... H01L 21/336; H01L 21/8234
[52] U.S. Cl. ................ 438/197; 438/199; 438/229; 438/230; 438/231; 438/183; 438/301; 438/305
[58] Field of Search ....................... 438/227, 183, 438/231, 305, 301

[56] References Cited

U.S. PATENT DOCUMENTS

| | | |
|---|---|---|
| 5,028,556 | 7/1991 | Chang . |
| 5,494,851 | 2/1996 | Lee et al. . |
| 5,950,081 | 9/1999 | Chang . |
| 5,981,326 | 11/1999 | Wanlass . |
| 5,994,179 | 11/1999 | Masuoka . |

*Primary Examiner*—John F. Niebling
*Assistant Examiner*—Jonathan Hack
*Attorney, Agent, or Firm*—Myers Bigel Sibley & Sajovec

[57] ABSTRACT

Multiple implants are performed in an integrated circuit substrate by implanting ions into a face thereof. Then, a gate insulating layer and a gate electrode are formed on the face of the integrated circuit substrate after performing the multiple implants in the integrated circuit substrate. Preferably, ions are not implanted into the integrated circuit substrate through the face after forming the gate insulating layer and the gate electrode on the face of the integrated circuit substrate. By preferably performing all implants prior to forming a gate insulating layer, the gate insulating layer is not degraded by implanting ions into the face of the integrated circuit substrate through the gate insulating layer.

10 Claims, 4 Drawing Sheets

METHODS OF FABRICATING INTEGRATED CIRCUIT FIELD EFFECT TRANSISTORS BY PERFORMING MULTIPLE IMPLANTS PRIOR TO FORMING THE GATE INSULATING LAYER THEREOF

FIELD OF THE INVENTION

This invention relates to methods of fabricating integrated circuit devices, and more particularly to methods of fabricating integrated circuit field effect transistors.

BACKGROUND OF THE INVENTION

Integrated circuits are widely used in consumer and industrial products. As is well known to those having skill in the art, integrated circuit devices, including but not limited to logic, memory and microprocessor devices, may include up to one million or more Field Effect Transistors (FETs). As the integration density of integrated circuits continues to increase, the size of the individual field effect transistors generally decreases. For example, the integration density of each succeeding generation of integrated circuits may increase by a factor of four. The dimensions of the field effect transistors, including a length of the channels thereof, may also decrease by a factor of four.

As the integration density of field effect transistors continues to increase, various "short channel effects" such as sub-threshold leakage and threshold variations may occur. Many techniques have been proposed to reduce short channel effects in submicron field effect transistors. For example, a surface implant may be used to control the threshold voltage of the field effect transistor. Contoured buried implants beneath the source and drain regions may also be used to reduce punch-through effects.

FIGS. 1 and 2 are cross-sectional views illustrating field effect transistors that may include additional regions to reduce short channel effects. Specifically, FIG. 1 illustrates a field effect transistor including spaced apart source and drain regions 14 in an integrated circuit substrate, such as a semiconductor substrate. A gate insulating layer, such as a gate oxide layer 12, and a gate electrode 13, such as a polysilicon gate electrode, are formed on the integrated circuit substrate between the spaced apart source and drain regions. Field oxide regions 11 isolate the field effect transistor. As shown in FIG. 1, a surface implant region 100 is formed by implanting ions into the semiconductor substrate before fabricating the gate oxide layer 12, the gate electrode 13 and the source/drain regions 14. The surface implant region 100 may be used to control the threshold voltage of the field effect transistor.

FIG. 2 is a cross-sectional view of another field effect transistor that includes a surface implant 100 to control threshold voltage and contoured buried implants 200 to reduce punch-through. As shown in FIG. 2, the contoured buried implants 200 are formed adjacent the bottoms of the source/drain regions 14.

Unfortunately, the formation of the surface implants and/or the contoured buried implants to overcome short channel effects may degrade the reliability of the gate oxide layer 12. In submicron field effect transistors, the gate oxide layer may be extraordinarily thin, and therefore may be more susceptible to degradation than in earlier generations of field effect transistors that employ relatively thick gate oxides.

SUMMARY OF THE INVENTION

It is therefore an object of the present invention to provide improved methods of fabricating integrated circuit field effect transistors.

It is another object of the present invention to provide improved methods of fabricating short channel integrated circuit field effect transistors.

It is still another object of the present invention to provide improved methods of fabricating short channel integrated circuit field effect transistors that need not degrade the gate insulating layer thereof.

These and other objects are provided, according to the present invention, by forming a plurality of implants in an integrated circuit substrate by implanting ions into a face thereof, and then forming a gate insulating layer and a gate electrode on the face of the integrated circuit substrate after forming the plurality of implants in the integrated circuit substrate. Preferably, ions are not implanted into the integrated circuit substrate through the face thereof after forming a gate insulating layer and a gate electrode on the face of the integrated circuit substrate. By preferably performing all implants prior to forming a gate insulating layer, the gate insulating layer is not degraded by implanting ions into the face of the integrated circuit substrate through the gate insulating layer.

More specifically, according to the invention, an integrated circuit field effect transistor is fabricated by forming buried implants in an integrated circuit substrate, remote from a face thereof, by selectively implanting ions into the face thereof. Then, a gate insulating layer and a gate electrode are formed on the face of the integrated circuit substrate, after forming the buried implants in the integrated circuit substrate. The buried implants are preferably contoured buried implants that reduce punch-though in the field effect transistor.

A surface implant also is preferably formed in the integrated circuit substrate, adjacent the face thereof, by implanting ions into the face thereof prior to the step of forming a gate insulating layer and a gate electrode on the face of the integrated circuit substrate. The surface implant is preferably a channel implant that controls the threshold voltage of the field effect transistor. Source and drain regions also are preferably formed in the integrated circuit substrate, adjacent the face thereof, by implanting ions into the face thereof prior to forming the gate insulating layer and the gate electrode on the face of the integrated circuit substrate.

In an embodiment of the present invention, the buried implants are fabricated prior to forming the gate insulating layer and the gate electrode by forming a first mask pattern including first openings on the face of the integrated circuit substrate. Ions are implanted into the face through the first openings to form the buried implants. A second mask pattern is then formed in the first openings. The first mask pattern is removed from the first openings to define second openings on the face of the integrated circuit substrate. The gate insulating layer and the gate electrode are then formed in the second openings.

In another embodiment, the buried implants and the surface implants also are formed prior to forming the gate insulating layer and the gate electrode. Specifically, a first mask pattern including first openings is formed on the face of the integrated circuit substrate. Ions are implanted into the face through the first openings to form the buried implants. A second mask pattern is formed in the first openings. The first mask pattern is removed from the first openings to define second openings on the face of the integrated circuit substrate. The surface implant is formed in the second openings. The gate insulating layer and the gate are then formed in the second openings.

In either of the above embodiments, source and drain regions also are preferably formed after forming the first mask pattern, but before forming the gate insulating layer and the gate. The source and drain regions are preferably formed by implanting ions into the first openings.

According to another aspect of the present invention, source and drain regions are formed in an integrated circuit substrate, adjacent a face thereof, by implanting ions into the face thereof. Then, a gate insulating layer and a gate electrode are formed on the face of the integrated circuit substrate after forming the source and drain regions. Prior to forming the gate insulating layer and the gate, a surface implant and a buried implant may also be formed in the integrated circuit substrate. A buried implant may also be formed in the integrated circuit substrate, beneath the surface implant and spaced apart therefrom, by implanting ions into the face thereof.

In an embodiment of this aspect of the present invention, the source and drain regions are formed by forming a first mask pattern including first openings on the face of the integrated circuit substrate. Ions are implanted into the face through the first openings to form the source and drain regions. The gate insulating layer and gate electrode are then formed by forming a second mask in the first openings and removing the first mask pattern from the first openings to define second openings on the face of the integrated circuit substrate. The gate insulating layer and the gate electrode are then formed in the second openings.

A buried implant may also be formed between the step of removing the first mask pattern and the step of forming a gate insulating layer and a gate. The buried implant may be formed by implanting ions into the face of the integrated circuit substrate through the second openings.

Accordingly, high performance, integrated circuit field effect transistors may be fabricated. Threshold voltage and punch-through controlling implants may be fabricated without degrading the fragile gate insulating layer of the integrated circuit field effect transistors.

DETAILED DESCRIPTION OF PREFERRED EMBODIMENTS

Figure 1:
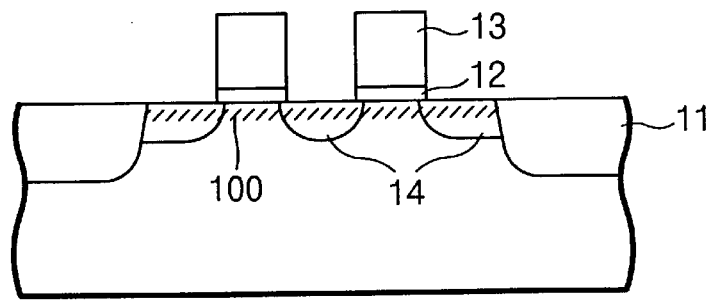
FIGS. 1 and 2 are cross-sectional views of conventional short channel integrated circuit field effect transistors.
Figure 2:
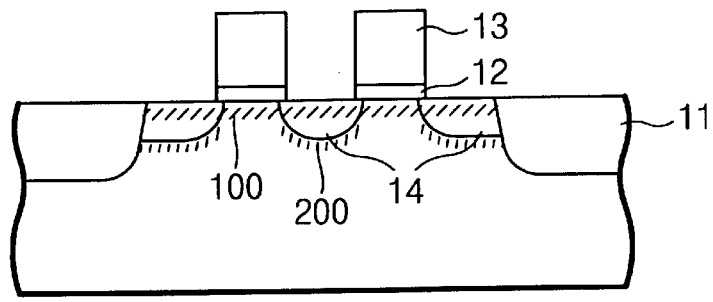

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. Moreover, each embodiment described and illustrated herein includes its complementary conductivity type embodiment as well.

Figure 3A:
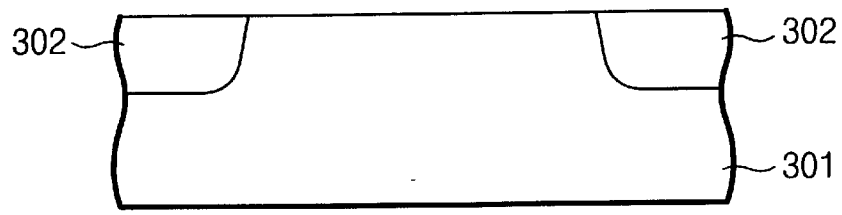
FIGS. 3A–3G are cross-sectional views of integrated circuit field effect transistors during intermediate fabrication steps, according to the present invention.

Referring now to FIGS. 3A–3G, methods of fabricating integrated circuit field effect transistors according to the present invention will now be described. As shown in FIG. 3A, isolation regions 302 are formed in an integrated circuit substrate 301, such as a silicon semiconductor substrate. The isolation regions 302 may be formed using conventional methods including but not limited to LOCal Oxidation of Silicon (LOCOS) and Shallow Trench Isolation (STI). The isolation regions 302 are formed adjacent a face of the integrated circuit substrate 301, shown as the top face in FIG. 3A.

Figure 3B:
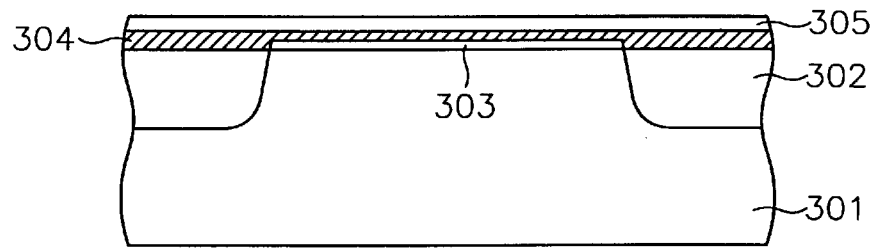

Referring now to FIG. 3B, a buffer oxide layer 303 is formed on the face of the integrated circuit substrate 301, for example by a conventional oxidation process. A first silicon nitride ($Si_3N_4$) layer 304 is formed on the buffer oxide layer 303. The first silicon nitride layer 304 may have a thickness of between about 100 Å and about 300 Å. A first silicon dioxide ($SiO_2$) layer 305 is formed on the first silicon nitride layer 304, and may have a thickness of between about 100 Å and about 300 Å. As is known to those having skill in the art, the first silicon nitride layer 304 and the first silicon dioxide layer 305 have an etching selectivity relative to one another. Other layers may be used that preferably have etching selectivities relative to one another. Moreover, the layers that are formed on the isolation regions 302 should preferably have an etching selectivity relative to the isolation regions 302 to prevent the isolation regions 302 from being recessed.

Figure 3C:
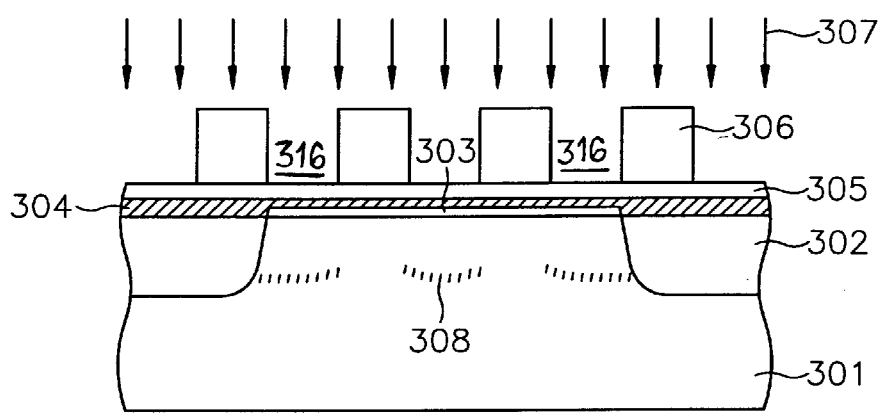

Referring now to FIG. 3C, a second silicon nitride layer 306 is formed on the first silicon dioxide layer 305. The second silicon nitride layer 306 is patterned to form a first mask pattern including first openings 316 on the face of the integrated circuit substrate 301. Patterning may be formed using conventional photolithography steps. The first silicon dioxide layer 305 can function as an etch stop during this process.

Still referring to FIG. 3C, ions 307 are implanted into the face of the integrated circuit substrate through the first openings 316, to form contoured buried implants 308. The contoured buried implants may be used to reduce punch-through. For example, p-type ions 307, such as boron difluoride ($BF_2$) and/or boron (B) may be implanted into the face of the integrated circuit substrate 301 using the first mask pattern 306 as a mask. The depth of the buried implants 308 may be controlled using the implant energy, and is preferably selected so as to place the buried implants 308 adjacent the bottoms of the source and drain regions that are formed later. The sidewall profile of the first mask pattern 306 preferably has an angle of between about 80° and about 90° in order to improve the alignment margins of the contoured buried implant 308. It will also be understood that the buried implants may be flat, rather than contoured.

Figure 3D:
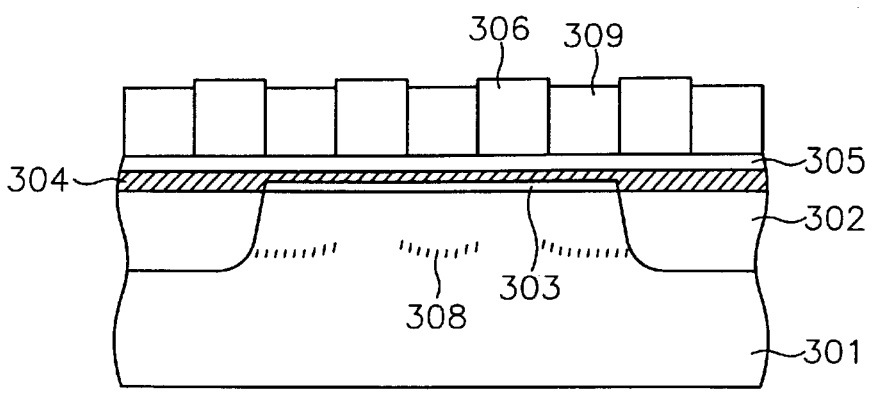

Referring now to FIG. 3D, a second mask pattern 309 is formed in the first openings. The second mask pattern 309 may be a second silicon dioxide layer that has an etch selectivity relative to the first mask layer 306. The second mask pattern 309 may be formed by blanket forming a second layer of silicon dioxide in the first openings 316 and on the first mask pattern 306, and then etching the second silicon dioxide layer using Chemical Mechanical Polishing (CMP) or other conventional techniques.

Figure 3E:
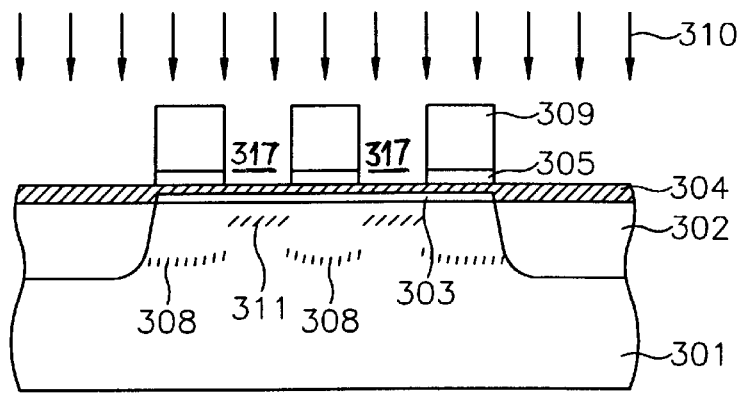

Referring now to FIG. 3E, the first mask pattern 306 is removed, for example by wet etching in phosphoric acid, thus defining second openings 317 on the face of the integrated circuit substrate. The exposed portions of the first silicon dioxide layer 305 may also be removed from the second openings 317, as shown in FIG. 3E.

Still referring to FIG. 3E, a surface implant 311 is formed in the integrated circuit substrate, adjacent the face thereof, by implanting second ions 310 into the face, using the second mask pattern 309 as a mask. The surface implant 311 has a shallow depth from the face of the integrated circuit substrate 301 compared to the buried contoured implants 308. The surface implant 311 can be used to control the threshold voltage in short channel field effect transistors. P-type impurities 310, such as boron difluoride and/or boron may be used to form the surface implant 311.

Figure 3F:
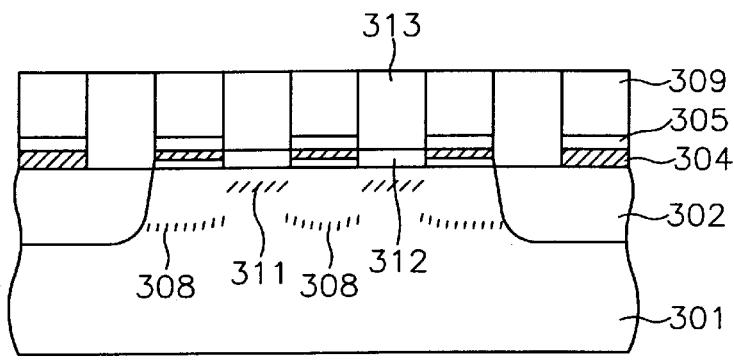

Referring now to FIG. 3F, the exposed portions of the first silicon nitride layer 304 and the buffer oxide layer 303 are then sequentially etched in the second openings 317, to expose the face of the integrated circuit substrate 301 in the second openings. A gate insulating layer such as a gate oxide layer 312 is then formed on the face of the integrated circuit substrate in the second openings 317. A gate electrode such as a polysilicon gate electrode 313 is then formed on the gate insulating layer 312 in the second openings 317. It will be understood that an optional cleaning step may be performed on the integrated circuit substrate 301 before forming the gate insulating layer 312. This cleaning step may enlarge the second openings 317, thereby increasing the overlap margins between the later formed source and drain regions and the gate of the field effect transistor.

Figure 3G:
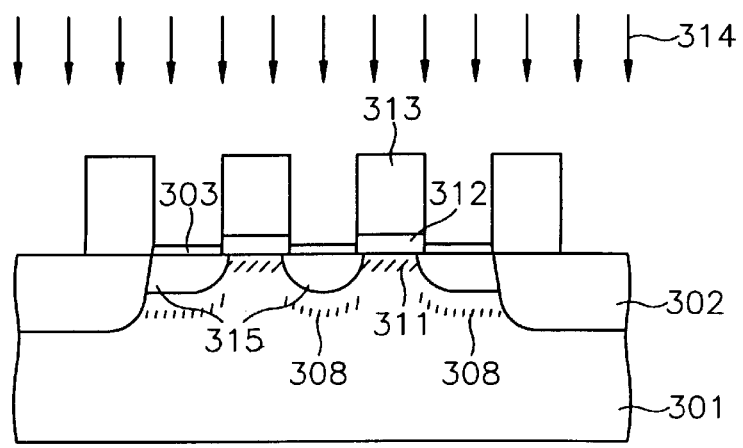

Referring now to FIG. 3G, the second mask pattern 309 is then removed, along with the first silicon dioxide layer 305 and the first silicon nitride layer 304. The source and drain regions 315 are then formed by implanting ions 314 into the face of the substrate, using the gate electrodes 313 as an implantation mask. For example, n-type impurities such as phosphorus (P) and/or arsenic (As) may be implanted using the gate electrode 313 as a mask.

In a preferred embodiment according to the present invention, the implantation of ions 314 to form the source and drain regions 315 may be performed as part of the operations of FIG. 3C, prior to or after forming the contoured buried implants 308. Thus, preferably, no implants take place after forming the gate insulating layer 312.

According to another aspect of the invention, the step of implanting ions 307 to form a contoured buried implant 308 may be omitted. Instead, the step of implanting ions 310 to form the surface implant 311 may be performed. This can reduce the parasitic junction capacitance of the integrated circuit field effect transistor.

Figure 4:
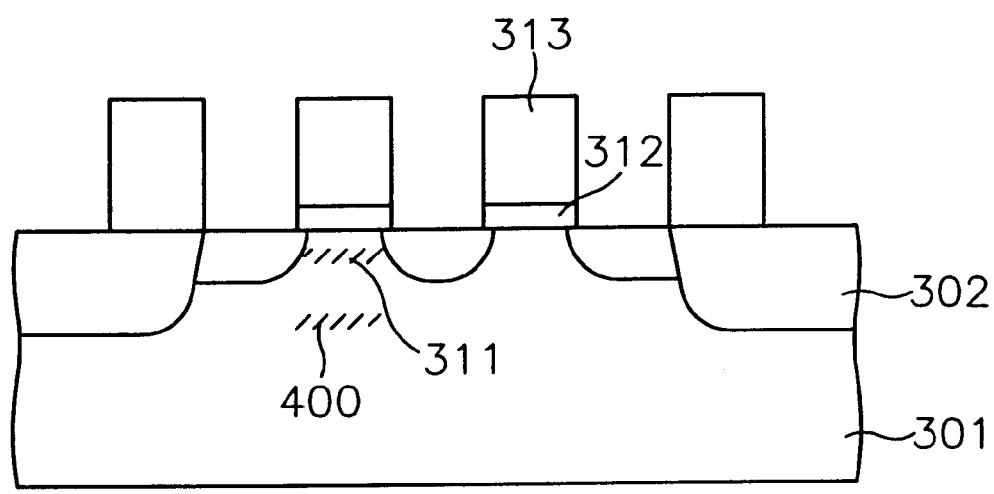
FIG. 4 is a cross-sectional view of a field effect transistor that is fabricated according to another aspect of the present invention.

FIG. 4 is a cross-sectional view of integrated circuit field effect transistors that can be fabricated using alternate methods according to the present invention. More specifically, in order to form integrated circuit field effect transistors of FIG. 4, the step of first implanting ions 307 through the first openings 316 in the first mask 306 is not performed in FIG. 3C, but rather is performed as part of the operations of FIG. 3E. Thus, a buried implant is formed by implanting ions through the second openings 317 in the second mask 309, similar to the step of forming the surface implant 311. For example, p-type ions may be implanted at both low and high energies through the second openings 317 in the second mask 309, to form both a surface implant 311 and a buried implant 400 beneath the surface implant 311. The surface implant 311 may be used to control the threshold voltage and the buried implant 400 may be used to prevent punch-through.

Accordingly, multiple implants are performed in an integrated circuit substrate prior to forming a gate insulating layer and a gate electrode on the face of the integrated circuit substrate. Ions are preferably not implanted into the integrated circuit substrate after forming the gate insulating layer and a gate. The reliability of the gate insulating layer therefore can be maintained.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of fabricating an integrated circuit field effect transistor comprising the steps of:

forming a first mask pattern including first openings on a face of an integrated circuit substrate;

implanting ions into the face through the first openings to form buried implants that are remote from the face;

forming a second mask pattern in the first openings;

removing the first mask pattern from the first openings to define second openings on the face of the integrated circuit substrate;

forming surface implants in the integrated circuit substrate, adjacent the face thereof, by implanting ions into the face through the second openings; and then forming a gate insulating layer and a gate electrode in the second openings.

2. A method according to claim 1 wherein the buried implants are contoured buried implants that reduce punch-through in the field effect transistor.

3. A method according to claim 1 wherein the surface implant is a channel implant that controls the threshold voltage of the field effect transistor.

4. A method according to claim 1 wherein the following step is performed between the steps of forming a first mask pattern and forming a gate insulating layer and a gate electrode:

forming source and drain regions in the integrated circuit substrate, adjacent the face thereof, by implanting ions into the first openings.

5. A method of fabricating an integrated circuit field effect transistor comprising the steps of:

forming a first mask pattern including first openings on a face of an integrated circuit substrate;

implanting ions into the face through the first openings to form source and drain regions;

forming a second mask pattern in the first openings;

removing the first mask pattern from the first openings to define second openings on the face of the integrated circuit substrate;

performing both shallow and deep ion implantations into the face through the second openings to form respective surface implants and buried implants beneath the surface implants and between the source and drain regions; and forming a gate insulating layer and a gate electrode on the face in the second openings, such that the gate insulating layer and the gate electrode are adjacent the surface implants and between the source and drain regions.

6. A method according to claim 5 wherein the surface implants are channel implants that control the threshold voltage of the field effect transistor.

7. A method according to claim 5 wherein the buried implants are punch through implants that reduce punch through in the field effect transistor.

8. A method of fabricating an integrated circuit field effect transistor comprising the steps of:

forming spaced apart shallow implants adjacent a face of an integrated circuit substrate, spaced apart buried implants remote from the face and beneath the shallow implants, and source and drain regions between the buried implants and the shallow implants; and then forming a gate insulating layer and a gate electrode on the face, adjacent the shallow implants, between the source and drain regions.

9. A method according to claim 8 wherein the surface implants are channel implants that control the threshold voltage of the field effect transistor.

10. A method according to claim 8 wherein the buried implants are punch through implants that reduce punch through in the field effect transistor.

* * * * *